(12) United States Patent
Gowda et al.

(10) Patent No.: US 8,531,027 B2
(45) Date of Patent: Sep. 10, 2013

(54) PRESS-PACK MODULE WITH POWER OVERLAY INTERCONNECTION

(75) Inventors: Arun Virupaksha Gowda, Niskayuna, NY (US); Ahmed Elasser, Niskayuna, NY (US); Satish Sivarama Gunturi, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 409 days.

(21) Appl. No.: 12/771,892

(22) Filed: Apr. 30, 2010

(65) Prior Publication Data
US 2011/0266665 A1 Nov. 3, 2011

(51) Int. Cl.
*H01L 23/34* (2006.01)
(52) U.S. Cl.
USPC ............... 257/726; 257/785; 257/E23.169
(58) Field of Classification Search
USPC .................... 257/726, E23.169, 785
See application file for complete search history.

(56) References Cited

U.S. PATENT DOCUMENTS

| | | | |
|---|---|---|---|
| 5,637,922 A | 6/1997 | Fillion et al. | |
| 5,808,874 A * | 9/1998 | Smith | 361/769 |
| 5,977,568 A * | 11/1999 | Klaka et al. | 257/108 |
| 6,306,680 B1 | 10/2001 | Fillion et al. | |
| 6,396,153 B2 | 5/2002 | Fillion et al. | |
| 7,262,444 B2 | 8/2007 | Fillion et al. | |
| 2003/0001258 A1* | 1/2003 | Kodama et al. | 257/727 |
| 2005/0208750 A1* | 9/2005 | Hsu et al. | 438/614 |

\* cited by examiner

*Primary Examiner* — Caridad Everhart
(74) *Attorney, Agent, or Firm* — Ann M. Agosti

(57) ABSTRACT

Systems and methods for utilizing power overlay (POL) technology and semiconductor press-pack technology to produce semiconductor packages with higher reliability and power density are provided. A POL structure may interconnect semiconductor devices within a semiconductor package, and certain embodiments may be implemented to reduce the probability of damaging the semiconductor devices during the pressing of the conductive plates. In one embodiment, springs and/or spacers may be used to reduce or control the force applied by an emitter plate onto the semiconductor devices in the package. In another embodiment, the emitter plate may be recessed to exert force on the POL structure, rather than directly against the semiconductor devices. Further, in some embodiments, the conductive layer of the POL structure may be grown to function as an emitter plate, and regions of the conductive layer may be made porous to provide compliance.

19 Claims, 4 Drawing Sheets

PRESS-PACK MODULE WITH POWER OVERLAY INTERCONNECTION

BACKGROUND OF THE INVENTION

The subject matter disclosed herein relates to electronic devices, and more particularly, to press-pack semiconductor modules using power overlay interconnections.

In various power electronic systems, press-pack semiconductor packages may be used to control power distribution to the various applications and devices of the power electronic system. A press-pack semiconductor package may generally include a number of semiconductor chips which function as current switches for relatively high voltage ranges. The semiconductors used in the package may have certain limitations, such as maximum breakdown voltage and current carrying capability. Due to the blocking voltage limitations of each individual semiconductor, several semiconductors may be connected in series to achieve the required voltage and to function in a higher power system. For example, insulated gate bipolar transistors (IGBTs) may have a relatively low voltage breakdown, and several IGBTs may be interconnected within a semiconductor package in parallel for high current capability and several IGBT packages could be connected in series in a stack to meet high voltage requirements, and hence allow switching in relatively high power applications. Furthermore, due to the need for high current in power electronic systems, semiconductor chips may also be arranged in sub-groups within a semiconductor package. For example, several groups of series-connected IGBTs may also be arranged in parallel in the package.

The semiconductor chips in a press-pack semiconductor stack may be interconnected by contacting the sides (e.g., the top and bottom side) of the semiconductor chips with two conductive plates. To ensure connections with all the semiconductor chips in the package, the two conductive plates may exert some amount of pressure against the contact points of all the semiconductors in the package. However, the commercial state of the art of semiconductor packages may use complex interconnections due to the many semiconductor chips used for higher power applications and/or the many sub-groups of chips arranged in the package. Further, the contact points of all the chips in a package may not be precisely planar across the entire package. As such, the amount of pressure exerted by the conductive plates to interconnect the semiconductor chips may be calibrated and/or manipulated to ensure chip interconnection while preventing chip damage.

Springs may be used in press-pack semiconductor packages to compensate for imprecise forces exerted to each semiconductor chip across the press-pack package. For example, a spring may be positioned at the contact points of each semiconductor chip to provide compressional force against some range of force applied by either or both of the conductive plates. However, in complex designs of commercial semiconductor packages, and with the small sizes of existing semiconductor chips, typical springs may not be sufficient to accurately align with the semiconductor chips in the package.

BRIEF DESCRIPTION OF THE INVENTION

In one embodiment, a semiconductor package includes a first conductive plate, a power overlay (POL) structure disposed over the first conductive plate, one or more springs disposed over the POL structure, and a second conductive plate configured to contact substantially all of the one or more springs. The POL structure includes a plurality of semiconductor devices, a conductive layer electrically coupling the plurality of semiconductor devices within the semiconductor package, and a dielectric layer coupled to the conductive layer.

In another embodiment, a semiconductor package includes a collector plate and a power overlay (POL) structure disposed over the collector plate. The POL structure includes a plurality of semiconductor devices and a conductive layer configured to interconnect the plurality of semiconductor devices within the semiconductor package and configured to function as a first emitter for each of the plurality of semiconductor devices. The POL structure also includes a dielectric layer coupled to the conductive layer.

In yet another embodiment, a semiconductor package includes a semiconductor package including a first conductive plate and a power overlay (POL) structure disposed over the first conductive plate. The POL structure includes a plurality of semiconductor devices, a conductive layer connecting the plurality of semiconductor devices within the semiconductor package, and a dielectric layer coupled to the conductive layer. The semiconductor package further includes a second conductive plate recessed away from the plurality of semiconductor devices and contacting the POL structure.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
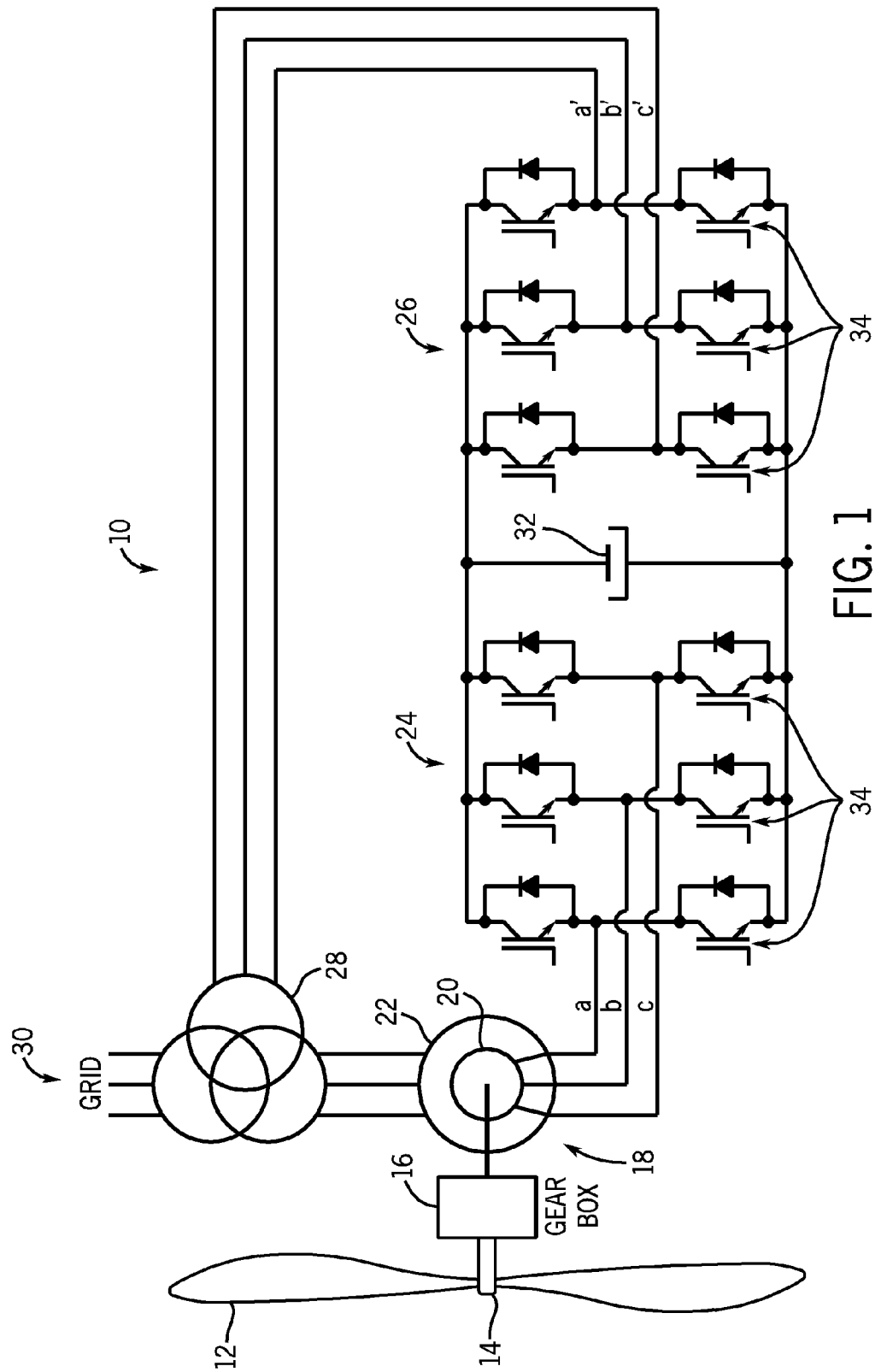
FIG. 1 illustrates a block diagram of an electronic system which may include semiconductor devices in accordance with an embodiment of the present invention.

Turning to the figures, FIG. 1 depicts a wind power converter system 10 which may include press-pack semiconductor modules, in accordance with the present disclosure. The wind power converter system 10 may be suitable for capturing power from wind using turbine blades 12 and converting the captured wind power into mechanical power, and the mechanical power into electrical power. The system 10 may include a gearbox 16 connected to the turbine rotor 14 of the turbine blades 12. The gearbox 16 may adapt the relatively low speed of the turbine rotor 14 with the relatively high speed of a generator 18.

The generator 18 may convert the mechanical power into electrical power, and may be, for example, an induction generator or a synchronous generator. For example, the generator 18 illustrated in FIG. 1 may be a doubly fed induction generator (DFIG), which includes a rotor winding 20 and a stator winding 22. The stator winding 22 of the generator 18 may be connected to a transformer 28 which transfers electrical power through inductively coupled conductors to a suitable voltage level for an electrical grid 30. The grid 30 may be an interconnected network which delivers electrical power to various other electrical devices or networks. The rotor winding 20 of the generator 18 may be connected to the grid 30 by converters 24 and 26 which decouple mechanical and electrical frequencies (e.g., to enable variable-speed operation).

The system 10 may include two three-phase AC-DC converters 24 and 26 linked by a DC capacitor battery 32. The converter 24 connected to the rotor winding 20 of the generator 18 may be referred to as the rotor side converter 24, while the converter 26 connected to the grid 30 by the transformer 28 may be referred to as the grid side converter 26. The bidirectional converters 24 and 26 may enable vector control of the active and reactive powers delivered to the grid 30 and may also increase power quality and angular stability and decrease the harmonic content introduced into the grid 30 (e.g., via filters).

As the converters 24 and 26 may be used for varying levels of power control, and may use relatively high power (voltage and current), the transistors used in the converters 24 and 26 may be suitable for switching high voltages. As semiconductor switches may have inherent limitations for maintaining thermal stability, several semiconductor devices may be packaged together to control power for the system 10. For example, the converters 24 and 26 may include several insulated gate bipolar transistors (IGBTs) 34. In some embodiments, the IGBTs 34, or any other transistors used in the converters 24 and 26 may be packaged in one or more press-pack semiconductor packages structured and/or manufactured according to the embodiments described herein.

Figure 2:
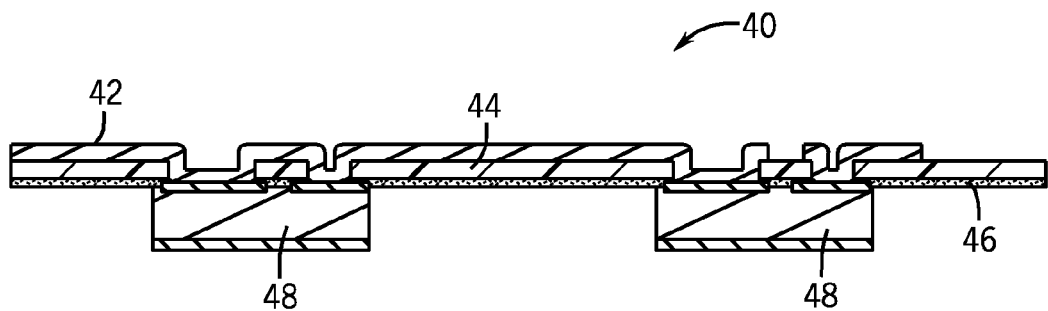
FIG. 2 illustrates a cross-sectional side view of a power overlay (POL) structure connecting semiconductor devices, in accordance with an embodiment of the present invention.

Technical effects of the invention include utilizing power overlay (POL) technology and semiconductor press-pack technology to produce semiconductor packages with higher power density and reliability. POL technology may refer to a method of interconnecting multiple semiconductor devices within a semiconductor package using a planar layer of conductive interconnections, rather than typical packaging techniques (e.g., wire-bonding techniques). As illustrated in FIG. 2, a POL structure 40 may include a copper layer 42 which provides conductive routes within the package, a dielectric (e.g., including polyimide and/or epoxy), referred to as the polyimide layer 44 which provides insulation within the package, and an adhesive layer 46 which may attach the semiconductor devices 48 to the polyimide layer 44. Implementing POL structures for interconnecting devices may enable a package having reduced thickness and area, reduced parasitic inductance, and reduced contact resistance.

Further, traditional packaging techniques typically use polymer materials and wire bonding interconnection technology which generally cannot be subjected to continuous exposure of relatively high temperatures without possible degradation and unreliability. Organic adhesion layers used in traditional packaging techniques may also cause undesirable levels of thermal stress on packaging structures for applications involving very cold temperatures or wide thermal cycles. Additionally, polymers in packaging structures which are not hermetically sealed may also cause problems in high moisture environments, since polymers tend to absorb moisture, which may undesirably raise the dielectric constants of the polymers and increasing parasitic capacitances.

In one or more embodiments, POL structures may have a low thermal resistance cooling path and one or more air gaps in the dielectric structure to relieve stresses at certain elevated temperatures. POL technology may also provide a more robust interconnect structure capable of withstanding thermal stresses caused by operation at elevated temperatures, along with decreased probability of damaging the semiconductor devices during the pressing of the conductive plates. Further, the POL structure may enable the stacking of multiple layers of devices for increased voltage capabilities. Different embodiments include various power overlay designs which include structures providing conductive routes between semiconductor devices in the package, as well as structures providing compliance to protect the devices from damage during the pressing of conductive plates.

Figure 3:
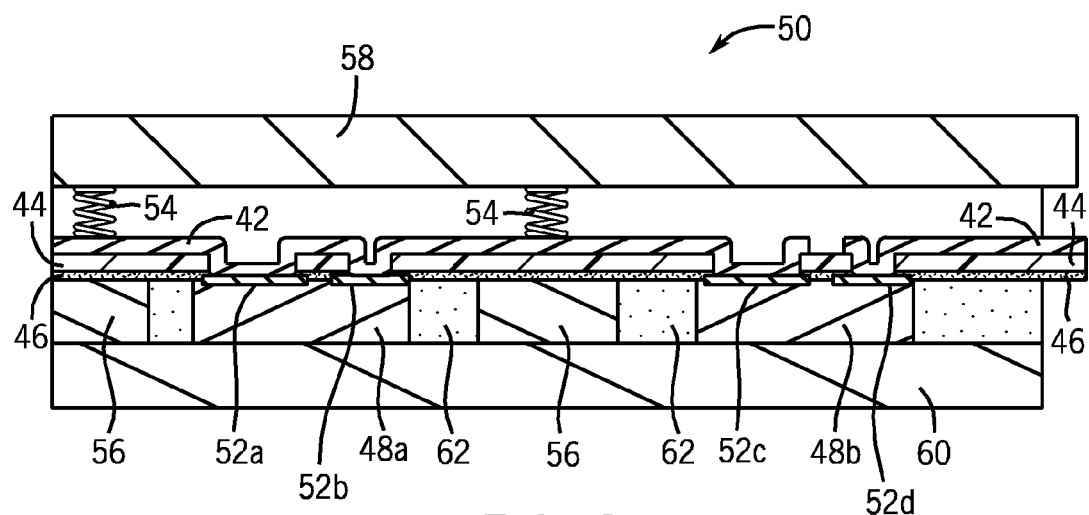
FIG. 3 illustrates a cross-sectional side view of a semiconductor press-pack, using a power overlay structure and including a spring and spacer, in accordance with an embodiment of the present invention.

A cross-sectional side view of a press-pack semiconductor package including POL interconnections and a spacer is illustrated in FIG. 3. As will be appreciated, the package 50 illustrated in FIG. 3 (as well as those illustrated in FIGS. 4-9 which will be later discussed) may not be drawn to scale. The package 50 may include several semiconductor die 48 disposed between an emitter plate 58 and a collector plate 60. For example, the spacers may be disposed over the collector plate 60 along with the die 48. The semiconductor die 48 may refer to semiconductor devices such as insulated gate bipolar transistors (IGBTs), metal oxide semiconductor field effect transistors (MOSFETs), bipolar junction transistors (BJTs), integrated gate-commutated thyristors (IGCTs), gate turn-off (GTO) thyristors, Silicon Controlled Rectifiers (SCRs), diodes or other devices or combinations of devices including materials such as Silicon (Si), Silicon Carbide (SiC), Gallium Nitride (GaN), Gallium Arsenide (GaAs), etc. For example, the semiconductor die 48 refer to any suitable semiconductor device which may be used in power conversion in a wind power converter system 10, as described in FIG. 1.

The die 48 may be in contact with the collector plate 60 and may be interconnected within the package 50 by a POL structure including a copper layer 42, a polyimide layer 44, and an adhesive layer 46. The copper layer 42 may be attached to the die 48 to provide conductive routes between the contact(s) 52 of each die 48 in the package 50. For example, the copper layer 42 may connect the emitter and/or anode regions at one or more die 48 in the package 50. Some embodiments may include a die 48 having more than one connected contact 52. For example, the left die 48a, which may be an IGBT, may have two contacts 52a and 52b (e.g., at two emitter pads) connected in parallel, with no isolation disposed between each of the contacts 52. The copper layer 42 may connect one IGBT to other IGBTs via their emitter pads. Some embodiments may also include die 48 which is connected to provide gate isolation. For example, the right die 48b may include a contact 52c at the emitter pad of the IGBT and a contact 52d at the gate pad of the IGBT. The contacts 52c and 52d may be isolated.

The POL structure may be substantially planar over a layer of die 48, and the spring forces resulting from the pressing of the emitter plate 58 and/or the collector plate 60 against the die 48 may be distributed to spacers 56 disposed beneath the springs 54. The spacers 56 may be compliant against the force of the spring 54, and may provide stress relief for the die 48 against the force of the spring 54. In some embodiments, the spacers 56 may be integrated into the collector plate 60, by machining or pre-attachment. Further, the areas between the die 48 and the spacers 56 may be filled with gel 62 or any other material which may provide insulation to each die 48 and may be sufficiently compressible to withstand lateral expansion from the spacers 56. Thus, the emitter plate 58 may interconnect the emitter or anodes of the die 48 in the package 50 via conductive routes provided by the copper layer 42 of the POL structure. In some embodiments, as will be discussed, the copper layer 42 may be sufficiently thick to serve as the emitter region of the package, and the emitter plate 58 may be eliminated.

Figure 4:
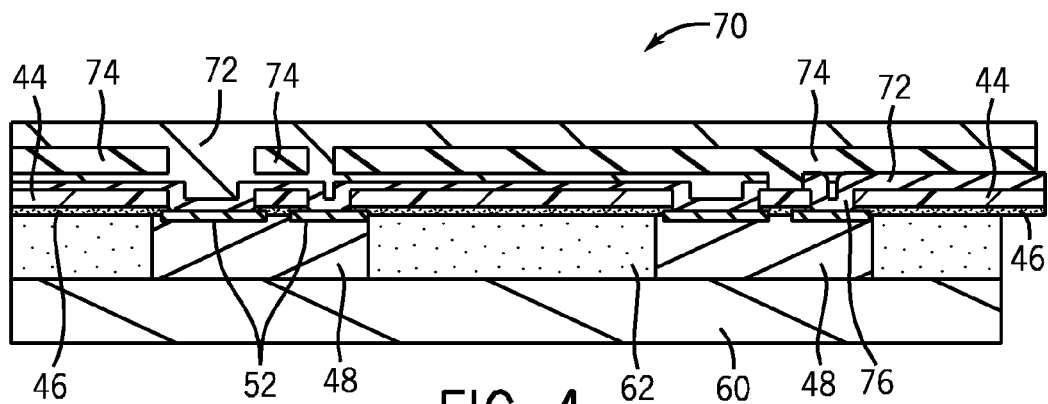
FIG. 4 illustrates a cross-sectional side view of a semiconductor press-pack, packaged with a thick copper power overlay interconnection structure, in accordance with an embodiment of the present invention.
Figure 5:
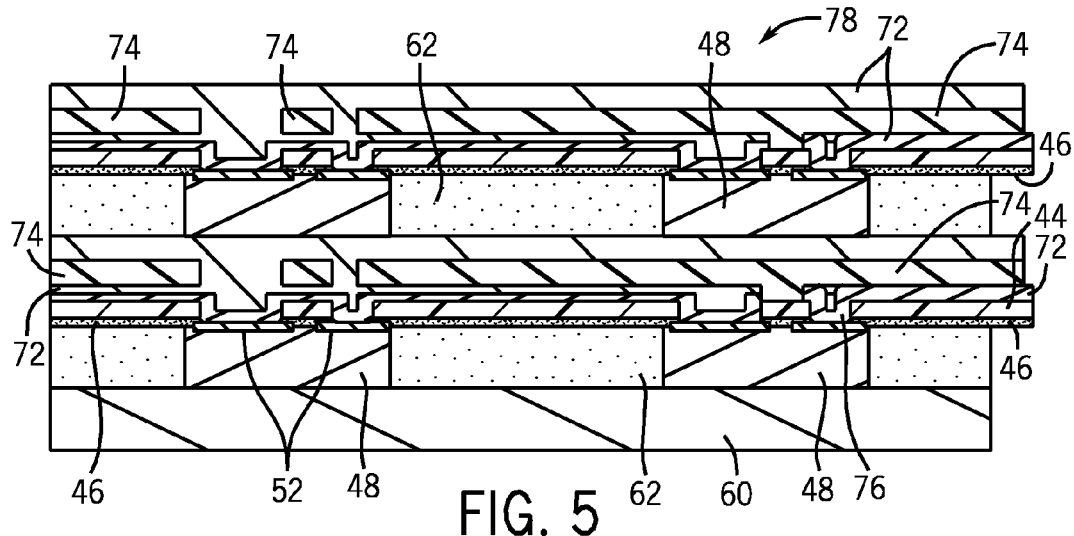
FIG. 5 illustrates a cross-sectional side view of a semiconductor press-pack having two layers semiconductor devices and power overlay structures, in accordance with an embodiment of the present invention.

Another embodiment of a semiconductor press-pack package is provided in the cross sectional side view of a semiconductor packaged with a thick copper POL structure, as illustrated in FIG. 4. The package 70 may include a POL structure interconnecting several semiconductor die 48 disposed on a collector plate 60. The POL structure includes a copper plate 72 which may be sufficiently thick to serve as the emitter plate for the package 70. For example, the copper plate 72 may be approximately several hundred micrometers thick in some embodiments. The copper plate 72 may be substantially planarized by, for example, pulse plating or grinding, and may be separated from the gate 76 of the device by providing insulation between the gate contact 76 and the emitter plate 72. Some embodiments may include die 48 which may be insulated between the emitter and gate junctions via an insulator 74.

In some embodiments, a higher voltage may be achieved in a single package by stacking two layers of die 48 and POL structures in series. For example, the package 78 illustrated in FIG. 5 may include an additional layer of die disposed over the emitter plate 72 as well as an additional POL structure including a second adhesive layer, a second polyimide layer, and a second emitter plate which also connects the additional layer of die within the package 78. In such an embodiment, the voltage capability of the package 78 may be increased without significantly increasing the size of the package 78.

Figure 6:
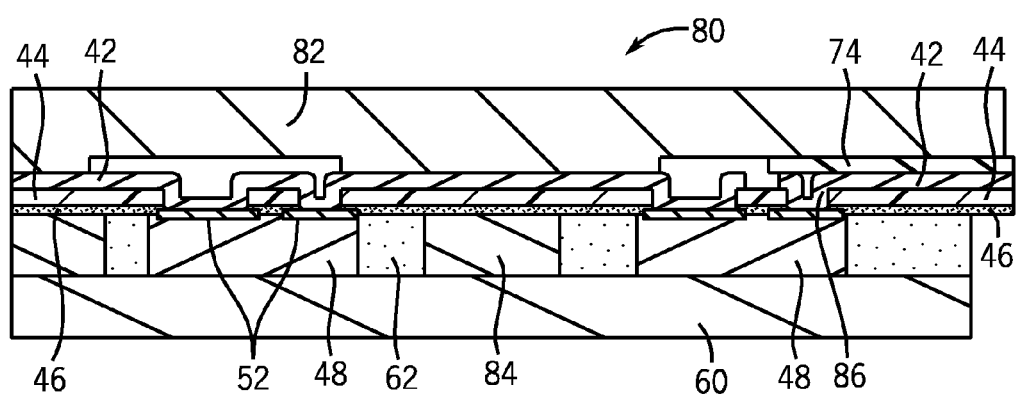
FIG. 6 illustrates a cross-sectional side view of a semiconductor press-pack packaged with a power overlay structure having a recessed conductor plate, in accordance with an embodiment of the present invention.

FIG. 6 is an illustration of a cross-sectional side view of a press-pack semiconductor packaged with a recessed emitter plate. In one embodiment, the package 80 includes a recessed emitter plate 82 which is recessed to separate the emitter plate 82 from the conductive routes to the device gates 86. Some of the recessed areas may be filled with insulator 74 or a gel material suitable for providing gate insulation between the emitter plate 82 and the portions of the POL copper layer 42 which connect and/or route the gates 86. In one embodiment, emitter plate 82 may be recessed to not exert direct force on the die 48 in the package 80, and to exert force on the portion of the copper layer 42 which is directly over one or more of the spacers 84 in the package 80. The spacers 84 may be relatively compliant and may be selected based on coefficient of thermal expansion properties. The spacers 84 may be made of materials such as molybdenum (with the polyimide layer 44 providing electrical insulation to the POL copper layer 42) or ceramic, for example. As the recessed emitter plate 82 may be recessed to exert force on the spacers 84 rather than on the die 48, possible damage to the die 48 may be reduced and/or prevented during the pressing of the emitter plate 82 against the copper layer 42 in the package 80.

Figure 7:
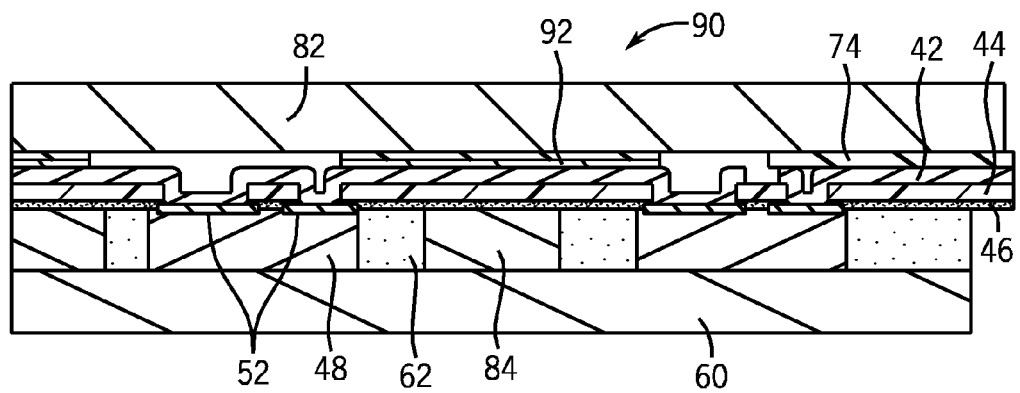
FIG. 7 illustrates a cross-sectional side view of a semiconductor press-pack packaged with a power overlay structure having a recessed conductive plate and liquid metal between the conductive plate and the power overlay structure, in accordance with an embodiment of the present invention.

A cross-sectional side view of another embodiment of a press-pack semiconductor packaged with a recessed emitter plate and a liquid metal layer is illustrated in FIG. 7. Similar to the package 80 of FIG. 6, the package 90 of FIG. 7 may also include a recessed emitter plate 82 which may be recessed to exert force on the spacers 84 in the package, thus reducing and/or preventing damage to the die 48. Additionally, the package 90 may include a liquid metal layer 92 in the contact area between the emitter plate 82 and the POL copper layer 42. The liquid metal layer 92 may accommodate for nonuniformities of the emitter plate 82 and/or the copper layer 42 and provide an improved conductive contact between the emitter plate 82 and the copper layer 42. In some embodiments, the liquid metal layer 92 may include pure gallium, gallium based alloys, indium zinc composites, indium tin composites, and/or any metal material having a melting point of approximately below 50° C. Furthermore, in some embodiments, the package 90 may include one or more barrier layers between the liquid metal layer 92 and the recessed emitter plate 82 and/or the POL copper layer 42 to protect the surfaces of the plate 82 and/or the copper layer 42 from corrosion by the liquid metal layer 92.

Figure 8:
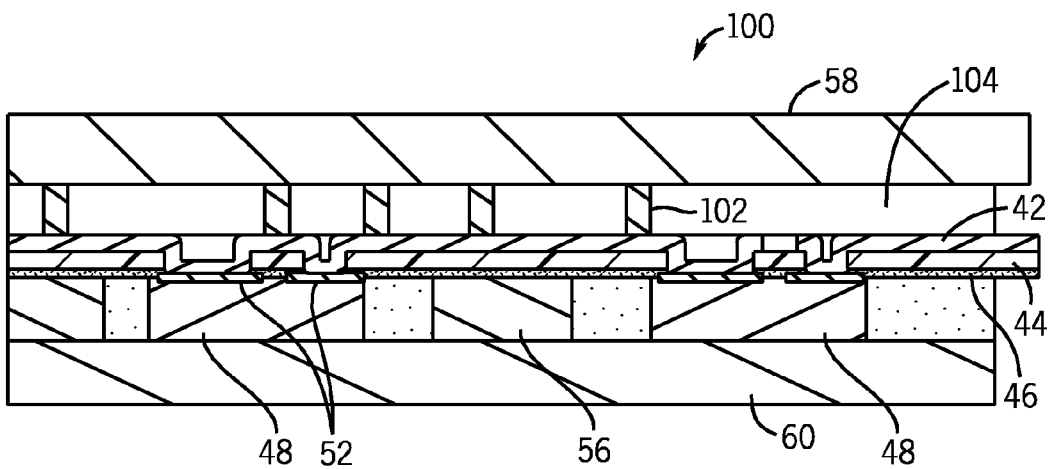
FIG. 8 illustrates a cross-sectional side view of a semiconductor press-pack packaged with a power overlay structure including metal posts and a silicone rubber mat, in accordance with an embodiment of the present invention.

In another embodiment, a cross sectional side view of semiconductor press-pack, illustrated in FIG. 8, includes a POL interconnection pressed by metal posts 102 disposed within a rubber mat 104 in the package 100. When the emitter plate 58 is pressed towards the tops of the die 48, the emitter plate 58 may make contact with one end of the metal posts 102 while the metal posts 102 makes contact with the POL copper layer 42. The rubber mat 104 may include a combination of silicone rubber, or any other material which may act as a spring to distribute uniform pressure to all the die 48 in the package 100. Further, the package 100 may also include spacers 56 which may be suitable for withstanding force exerted by the emitter plate 58 through the rubber mat 104. The spacers 56 may be compliant and may protect the die 48 from possible damage resulting from the force of the mat 104 against the layer of die 48. In another embodiment, the rubber mat 104 and metal posts 102 may be replaced by a metal foam which is sufficiently compliant and provides electrical and thermal conductivity.

Figure 9:
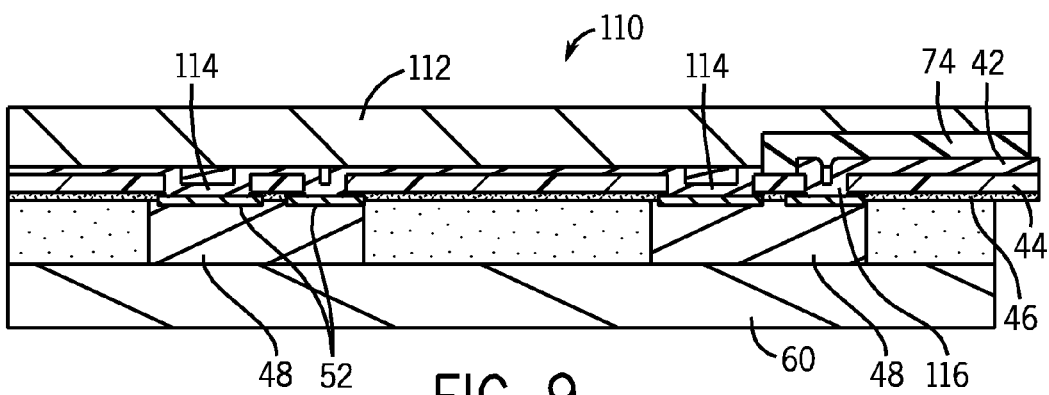
FIG. 9 illustrates a cross-sectional side view of a semiconductor press-pack packaged with a porous copper power overlay structure, in accordance with an embodiment of the present invention.

FIG. 9 is an illustration of a cross-sectional side view of a press-pack semiconductor package including a porous emitter plate. The package 110 includes a POL structure including a copper layer 42 and a polyimide layer 44, attached to a layer of die 48 in the package 110 by an adhesive layer 46. A porous copper emitter plate 112 may press against the POL structure and against the die 48. In some embodiments, the porous copper emitter plate 112 may be grown from the POL copper layer 42, and may be plated thick and planarized through plating (e.g., pulse plating, conventional plating, mechanical grinding, or any combination thereof). The emitter plate 112 may be recessed to separate the gate 116 of the device from the emitter 112, and the recessed region may be filled with an insulator 74 to provide gate insulation. The porosity of the emitter plate 112 may render the emitter plate 112 sufficiently compliant to make contact with the die 48 without the aid of springs or additional spacers (e.g., spring 54 and spacer 56 as in FIG. 3). For example, the emitter plate 112 may have a porosity of approximately 25-80%. In some embodiments, the emitter plate 112 may include metal foam, and may include a porous conductive metal. For example, the volume of the metal foam of the emitter plate 112 may have approximately 10-95% void spaces.

Figure 10:
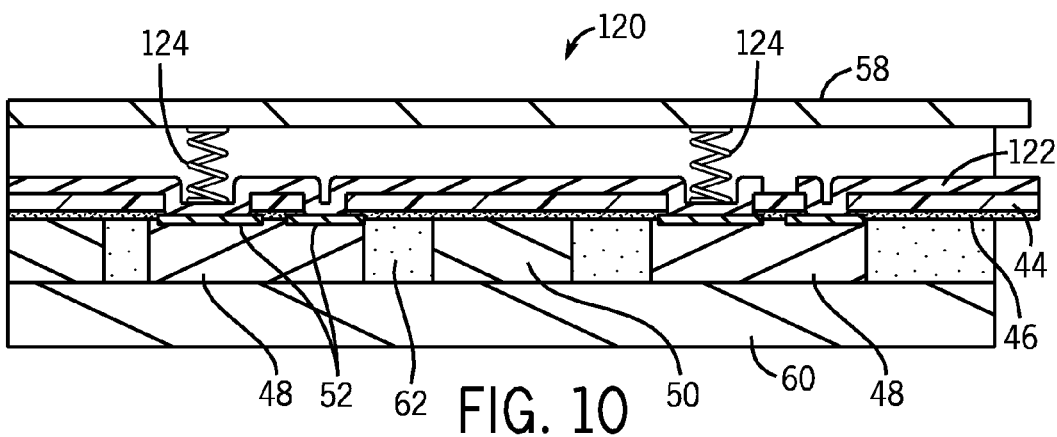
FIG. 10 illustrates a cross-sectional side view of a semiconductor press-pack packaged with a power overlay structure with copper springs grown from the copper layer, in accordance with an embodiment of the present invention.

A cross-sectional side view of another embodiment of a press-pack semiconductor package including copper springs grown from a POL copper layer is illustrated in FIG. 10. The package 120 may include a POL copper layer 122 which grows copper springs 124 near a back portion of the die 48. The copper springs 124 may be grown through microfabrication or glancing angle deposition (or GLAD), and may take the form of any structure, including spring-like structures, levers, or any other structure suitable for enabling contact with the emitter plate 58. Further, any suitable metal may be used to grow the copper springs 124. As the copper (or other suitable metal) springs 124 are grown from the conductive POL copper layer 124, contact between the emitter plate 58 and the springs 124 may achieve contact between the emitter plate 58 and the die 48. The package 120 may also include spacers 56 disposed between the die 48 which may be compliant against force exerted by the emitter plate 58.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A semiconductor package, comprising:
a first conductive plate;
a power overlay (POL) structure disposed over the first conductive plate, the POL structure comprising:
a plurality of semiconductor devices;
a conductive layer electrically coupling the plurality of semiconductor devices within the semiconductor package;
a dielectric layer coupled to the conductive layer; and
a plurality of spacers directly contacting the first conductive plate;
one or more springs disposed over the POL structure; and
a second conductive plate configured to contact substantially all of the one or more springs.

2. The semiconductor package of claim 1, wherein each of the one or more springs is positioned over a respective spacer of the plurality of spacers.

3. The semiconductor package of claim 1, wherein each of the one or more springs is configured to electrically couple the second conductive plate to one or more of the plurality of semiconductor devices through a conductive route in the conductive layer of the POL structure.

4. The semiconductor package of claim 1, wherein the POL structure comprises a plurality of spacers disposed over the first conductive plate.

5. The semiconductor package of claim 1, wherein each of the one or more springs is grown from the conductive layer of the POL structure.

6. The semiconductor package of claim 5, wherein each of the one or more springs grown from the conductive layer through one or more of microfabrication, glancing angle deposition (or GLAD), and thin film deposition methods.

7. The semiconductor package of claim 5, wherein each of the one or more springs is positioned over a back side of one or more of the plurality of semiconductor devices.

8. The semiconductor package of claim 1, comprising a plurality of conductive posts disposed over the POL structure, wherein the one or more springs comprises a mat comprising spring-like characteristics and a plurality of holes, each of the plurality of holes comprising each of the plurality of conductive posts.

9. The semiconductor package of claim 8, wherein the plurality of conductive posts are positioned to electrically couple the second conductive plate to the plurality of semiconductor devices via the conductive layer of the POL.

10. A semiconductor package, comprising:
a collector plate; and
a first power overlay (POL) structure disposed over the collector plate, wherein the first POL structure comprises:
a plurality of semiconductor devices;
a conductive layer configured to interconnect the plurality of semiconductor devices within the semiconductor package and configured to function as a first emitter for each of the plurality of semiconductor devices;
a dielectric layer coupled to the conductive layer; and
a plurality of spacers directly contacting the collector plate.

11. The semiconductor package of claim 10, comprising an insulator configured to insulate a gate of one of the plurality of semiconductor devices from an emitter portion of the conductive layer.

12. The semiconductor package of claim 10, comprising a gel disposed over the collector plate and around the plurality of semiconductor devices.

13. The semiconductor package of claim 10, wherein the POL structure comprises an adhesive layer configured to attach the plurality of semiconductor devices in the POL structure.

14. The semiconductor package of claim 10, comprising:
a second POL structure comprising a second plurality of semiconductor devices disposed over the conductive layer of the first POL structure.

15. The semiconductor package of claim 10, wherein the conductive layer comprises a porous region and is substantially compliant to force applied in a direction against the conductive layer and against the plurality of semiconductor devices.

16. A semiconductor package, comprising:
a first conductive plate;
a power overlay (POL) structure disposed over the first conductive plate, the POL structure comprising:
a plurality of semiconductor devices;
a conductive layer connecting the plurality of semiconductor devices within the semiconductor package;
a dielectric layer coupled to the conductive layer;
a plurality of spacers directly contacting the first conductive plate; and
a second conductive plate recessed away from the plurality of semiconductor devices and contacting the POL structure.

17. The semiconductor package of claim 16, wherein the plurality of spacers comprises metals such as molybdenum, ceramics such as aluminum nitride, any compliant material, or any combination of the above materials.

18. The semiconductor package of claim 16, wherein a recessed portion of the second conductive plate comprises an insulator strip configured to insulate a gate of one of the plurality of semiconductor devices from an emitter of the one of the plurality of semiconductor devices.

19. The semiconductor package of claim 16, comprising a liquid metal layer disposed between the conductive layer of the POL structure and the second conductive plate.

* * * * *